(12) United States Patent
Hwang et al.

(10) Patent No.: US 9,383,658 B2
(45) Date of Patent: Jul. 5, 2016

(54) ROLL-PRINTING APPARATUS AND ROLL-PRINTING METHOD USING THE SAME

(75) Inventors: Ji-Young Hwang, Daejeon (KR); In-Seok Hwang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 321 days.

(21) Appl. No.: 14/000,287

(22) PCT Filed: Feb. 24, 2012

(86) PCT No.: PCT/KR2012/001437
§ 371 (c)(1),
(2), (4) Date: Aug. 19, 2013

(87) PCT Pub. No.: WO2012/115483
PCT Pub. Date: Aug. 30, 2012

(65) Prior Publication Data
US 2013/0329210 A1 Dec. 12, 2013

(30) Foreign Application Priority Data
Feb. 24, 2011 (KR) .......................... 10-2011-0016749

(51) Int. Cl.
*B41F 16/00* (2006.01)
*G03F 7/20* (2006.01)
(Continued)

(52) U.S. Cl.
CPC .............. *G03F 7/70716* (2013.01); *B41F 3/22* (2013.01); *B41F 15/00* (2013.01); *B41F 16/00* (2013.01); *B41F 16/002* (2013.01)

(58) Field of Classification Search
CPC .............. B41F 9/00; B41F 9/01; B41F 9/003; B41F 9/023; B41F 17/08; B41F 17/10; B41F 13/193; B41F 15/00; B41F 16/00; B41C 1/00; B41M 1/10; B41M 1/26; G03F 7/70716; B41K 1/00; H01L 51/56; H01L 51/0004; H05K 13/00
USPC .................................................. 101/153, 170
See application file for complete search history.

(56) References Cited

U.S. PATENT DOCUMENTS

| 5,230,456 A | 7/1993 | Germann et al. |
| 7,654,427 B1 | 2/2010 | Tsai et al. |

(Continued)

FOREIGN PATENT DOCUMENTS

| CN | 1050000 A | 3/1991 |
| CN | 201235634 Y | 5/2009 |

(Continued)

*Primary Examiner* — Blake A Tankersley
*Assistant Examiner* — Marissa Ferguson Samreth
(74) *Attorney, Agent, or Firm* — Dentons US LLP

(57) ABSTRACT

Provided are a roll printing apparatus and a roll printing method using the same. The roll printing apparatus according to the present invention comprises 1) a first cliché stage, 2) a second cliché stage, 3) a pattern transfer unit provided between the first cliché stage and the second cliché stage and comprising a roll type printed film support unit, 4) a first printing unit comprising a first printing roll moving to the pattern transfer unit on the first cliché stage, and 5) a second printing unit comprising a second printing roll moving the pattern transfer unit on the second cliché stage, in which the first cliché stage and the second cliché stage are disposed on the same line and a film substrate is comprised in the roll type printed film support unit. The roll printing apparatus according to the present invention can perform a continuous roll printing, thereby reducing a tack time and as a result, improving productivity.

20 Claims, 5 Drawing Sheets

(51) Int. Cl.
  *B41F 15/00* (2006.01)
  *B41F 3/22* (2006.01)

(56) References Cited

U.S. PATENT DOCUMENTS

| | | | |
|---|---|---|---|
| 2007/0153182 A1 | 7/2007 | Bang | |
| 2010/0139513 A1* | 6/2010 | Seong | B41F 35/00 101/252 |
| 2012/0136476 A1 | 5/2012 | Baccini et al. | |
| 2013/0239831 A1* | 9/2013 | Lee | B41M 1/06 101/142 |

FOREIGN PATENT DOCUMENTS

| | | | | |
|---|---|---|---|---|
| JP | 2009-101676 A | | 5/2009 | |
| KR | 10-2010-0002068 A | | 1/2010 | |
| KR | 20100002068 A | * | 1/2010 | ............. B41F 16/00 |
| KR | 10-2010-0138529 A | | 12/2010 | |
| KR | 10-2011-0011461 A | | 2/2011 | |
| KR | 10-2011-0016135 A | | 2/2011 | |
| TW | 200724391 A | | 7/2007 | |
| TW | 201012722 A | | 4/2010 | |
| TW | 201104910 A | | 2/2011 | |

\* cited by examiner

Vacuum Path

→ 100

→ 90

ROLL-PRINTING APPARATUS AND ROLL-PRINTING METHOD USING THE SAME

This application claims priority to International Application No. PCT/KR2012/001437, filed Feb. 24, 2012, which claims the priority of Korean Patent Application No. 10-2011-0016749, filed on Feb. 24, 2011 in the Korean Intellectual Property Office, all of which are incorporated herein by reference.

TECHNICAL FIELD

The present invention relates to a roll printing apparatus and a roll printing method using the same, and more particularly, to a roll printing apparatus capable of reducing a tack time and improving productivity by continuous roll printing and a roll printing method using the same.

BACKGROUND ART

In general, fine patterns used in a semiconductor circuit device and display device such as an LCD, a PDP, and the like are formed by a photolithography using a photoresist and generally, manufactured through coating, exposing, developing, cleaning, and curing processes.

However, the photolithography has an advantage capable of precisely acquiring a desired pattern, but has disadvantages of performing a process having lots of steps, using various kinds of materials in order to maximize an effect of the photoresist, and consuming a lot of photoresist in a coating process and the like.

Recently, in order to solve the disadvantages of the photoresist, a technique of acquiring fine patterns by a roll printing method has been proposed to be researched and developed.

The roll printing apparatus for forming a pattern may be variously applied to methods such as offset printing, reverse offset printing, roll-to-roll printing, and the like and may be widely applied to colors of red R, green G, and blue B which are constituent elements of a color filter and black matrix (BM) patterns, patterns for electrode formation of a thin film transistor (TFT) and a plasma display panel (PDP), pattern transfer of a barrier material.

The roll printing apparatus generally comprises a coater, a printing roll, a printing roll driving device, a cliché, or a driving device for a substrate stage and stage alignment as the most basic constituent element. In addition, the roll printing apparatus may further comprise a cliché and/or pipe cleaning device, a drying device for drying a blanket by absorbing a solvent absorbed in the blanket, various sensor devices, and the like.

Precision of the pattern formed by the roll printing method and pattern transfer efficiency largely depends on process conditions such as a coating state of a roll or a blanket of the roll from the coater, a volatile degree and a waiting time of a solvent before being transferred to the cliché or substrate after coating, a printing pressure formed by a gap between a stage and a roll or blanket during transfer, and the like.

Particularly, during the coating with the roll or the blanket which is the first step of the roll printing process, uniformity of the entire patterns and whether or not to form various forms of spots are determined according to the coating state.

In the roll printing apparatus, generally, after the printing roll performs a printing process once, until the printing roll is prepared again and the printing process such as the coating on the printing roll and the like is performed, there is a disadvantage in that a tack time is inevitably required.

Herein, the tack time, as a time taken when the next glass substrate is carried in again after one product is carried out, is adjusted by controlling the number of other equipment based on a time taken when the glass substrate is carried in to and carried out from photo equipment in manufacturing of a liquid crystal display (LCD) and even in the printing roll, similarly, means a time taken when one printing roll is in and out. In the case of the roll printing, a limitation occurs in that a production speed is relatively slower than the photo equipment due to the tack time.

DETAILED DESCRIPTION OF THE INVENTION

Technical Problem

The present invention has been made in an effort to provide a roll printing apparatus capable of improving a tack time and improving productivity by performing a continuous roll printing and a roll printing method using the same.

Technical Solution

An exemplary embodiment of the present invention provides a roll printing apparatus, comprising:
1) a first cliché stage;
2) a second cliché stage;
3) a pattern transfer unit provided between the first cliché stage and the second cliché stage and comprising a roll type printed film support unit;
4) a first printing unit comprising a first printing roll moving to the pattern transfer unit on the first cliché stage; and
5) a second printing unit comprising a second printing roll moving the pattern transfer unit on the second cliché stage, in which the first cliché stage and the second cliché stage are disposed on the same line and a film substrate is comprised in the roll type printed film support unit.

Further, the present invention provides a roll printing method using the roll printing apparatus.

Another exemplary embodiment of the present invention provides a roll printing method, comprising:
1) preparing a first stage with a first cliché and a second stage with a second cliché on the same line and preparing a pattern transfer unit provided at the lower portion between the first stage and the second stage and comprising a roll type printed film support unit with a roll type film substrate;
2) moving a first printing roll coated with first ink to the pattern transfer unit on the first stage and printing the first ink on the film substrate;
3) moving a second printing roll coated with second ink to the pattern transfer unit on the second stage while returning the first printing roll to the initial position and printing the second ink on the film substrate; and
4) repeating step 1) to step 3 in sequence while returning the second printing roll to the initial position.

Advantageous Effects

According to the present invention, it is possible to perform a continuous roll printing by performing a printing process with one printing roll and performing a printing process with the other printing roll while returning the printing roll, by using a pair of printing roll devices. Accordingly, the present invention can reduce a tack time and as a result, it is possible to largely improve productivity. Further, in this case, the printed substrate and the next printing substrate can be efficiently replaced with each other, thereby improving productivity.

EXPLANATION OF REFERENCE NUMERALS AND SYMBOLS

Figure 1:
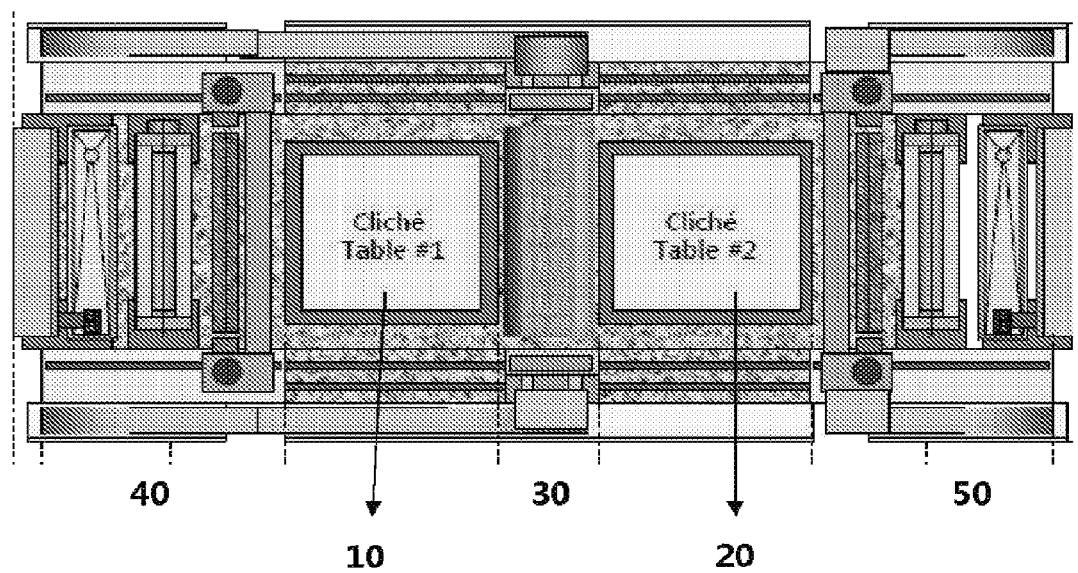
FIG. 1 is a plan view schematically illustrating a roll printing apparatus according to an exemplary embodiment of the present invention.

10: First cliché stage
20: Second cliché stage
30: Pattern transfer unit
40: First printing unit
50: Second printing unit
60: Fixing roll
70: Free rotation roll
80: Porous sheet
90: Vacuum hole forming area of fixing roll
100: Vacuum hole forming area of free rotation roll
110: Blanket
120: Film substrate

BEST MODE

Hereinafter, the present invention will be described in detail.

A general roll printing apparatus in the related art is basically configured by a coater, a printing roll, a printing roll driving device, a cliché stage, and a substrate stage. A blanket winds around the printing roll, and a cliché and a substrate are mounted on the cliché stage and the substrate stage, respectively. The printing roll may be formed in a cylindrical shape and the blanket is comprised on the outer surface thereof. The blanket may be formed of a rubber material having adhesion with ink and elasticity.

The printing roll is provided so as to relatively reciprocate between the cliché and the substrate to receive a pattern from the cliché to be re-transferred to the substrate.

The cliché stage and the substrate stage may be installed at a lower frame, and the cliché stage and the substrate stage may be separated from the lower frame, respectively so that the cliché having various patterns may be applied according to various target patterns.

The printing roll is driven by a driving device such as a printing roll driving motor to move (reciprocate) while rotating above the lower frame and in this case, while the printing roll rotates, the blanket comprised at the outer surface of the printing roll is in contact with the cliché and the substrate to transfer the pattern from the cliché to the substrate.

However, the roll printing apparatus in the related art comprises a coater, a printing roll, and the like only at one side of the roll printing apparatus and prints the substrate with the printing roll, returns the printing roll to an initial position, and then coats and prints the blanket of the printing roll with ink by using the coater. The printing form has a problem that production efficiency is lower in comparison with a photo process in the related art in the tack time.

In order to solve the problem in the related art, the present invention provides a continuous roll printing apparatus capable of performing a printing process with one printing roll and performing a printing process with the other printing roll while returning one printing roll by using a pair of printing roll devices.

The roll printing apparatus according to the present invention comprises 1) a first cliché stage, 2) a second cliché stage, 3) a pattern transfer unit provided between the first cliché stage and the second cliché stage and comprising a roll type printed film support unit, 4) a first printing unit comprising a first printing roll moving to the pattern transfer unit on the first cliché stage, and 5) a second printing unit comprising a second printing roll moving the pattern transfer unit on the second cliché stage, in which the first cliché stage and the second cliché stage are disposed on the same line and a film substrate is comprised in the roll type printed film support unit.

In the roll printing apparatus according to the present invention, the pattern transfer unit may comprise a printed film supplying unit continuously supplying the film substrates and a printed film collecting unit continuously collecting the film substrates. Further, the roll type printed film support unit may be disposed between the printed film supplying unit and the printed film collecting unit. Herein, the film substrate may be disposed at the printed film support unit.

The printed film supplying unit may be an unwinder and the printed film collecting unit may be a rewinder.

In the present invention, so long as the film substrates are continuously supplied by driving of the printed film supplying unit and the printed film collecting unit and the print pattern to be printed is transferred to the film substrate, a material or a thickness of the film substrate is not particularly limited.

In the present invention, the printed film supplying unit and the printed film collecting unit may continuously supply the film substrates so that the film substrates progress in one side direction. In the present invention, the printed film supplying unit may be an unwinder and the printed film collecting unit may be a rewinder. Hereinafter, the printed film supplying unit is exemplified as the unwinder and the printed film collecting unit is exemplified as the rewinder, but so long as the film substrates can be continuously supplied, the configuration thereof is not particularly limited.

As necessary, the driving of the unwinder and the rewinder may be intermittently controlled. As a result, in the present invention, intermittently continuous printing can be performed. In this specification, the term "intermittently continuous printing" may be understood so that the print pattern is transferred by continuously supplying the film substrate mounted at the unwinder and the rewinder on the roll type printed film support unit while the driving of the unwinder and the rewinder is intermittently controlled in a necessary step during the printing process. As described above, for the intermittently continuous printing, the roll printing apparatus may further comprise a controller intermittently controlling the driving of the unwinder and the rewinder.

The roll printing apparatus according to the present invention may further comprise a position controller which controls positions of the film substrate and the rewinder so that the film substrate is rewound at a position suitable for the rewinder when the film substrate is rewound around the rewinder. The position controller may be an electronic position controller (EPC).

The roll printing apparatus according to the present invention may further comprise a controller which stops the driving of the unwinder and the rewinder when a print target area of the film substrate is positioned on the roll type printed film support unit and restarts the driving of the unwinder and the rewinder after the transfer of the print pattern is completed.

The roll printing apparatus according to the present invention is advantageous to print a detailed pattern on the film substrate in the case of applying tension to the film substrate. For example, it is preferred that the roll printing apparatus is driven so as to apply the tension of 1 Kgf/m (film width) or more, 3 Kgf/m (film width) or more, and 5 to 10 Kgf/m (film width) or more to the film substrate. The tension may be applied by controlling the driving of the unwinder and the film substrate rewinder or a nipping unit to be described below. In this case, the roll printing apparatus according to the present invention may further comprise a tension controller of the film substrate.

When the first printing roll or the second printing roll moves to the pattern transfer unit, the film substrate is positioned on and in contact with the first printing roll or the second printing roll and thus the printing process may be performed.

The roll printing apparatus according to the present invention may further comprise a driving motor which vertically moves the roll type printed film support unit in the first printing roll or the second printing roll direction while rotating the roll type printed film support unit.

In the present invention, between the unwinder and the printed film support unit, between the rewinder and the printed film support unit, or both between the unwinder and the printed film support unit and between the rewinder and the printed film support unit, a nipping unit blocking the tension to the film substrate may further be comprised.

The nipping unit is fixed to the roll type printed film support unit to move together with the roll type printed film support unit when aligning the roll type printed film support unit. The nipping unit may move together with the roll type printed film support unit in a vertical direction.

In the present invention, since the film substrates are continuously supplied by the unwinder and the printed film rewinder, the position of the film substrate needs to be controlled so that the pattern can be printed at an accurate position during the printing and in this case, in order to control the position of the film substrate, the tension applied to the film needs to be blocked. In the present invention, the tension applied to the film may be blocked by the nipping unit. Further, the nipping unit may also serve to apply the tension of a predetermined level or more to the film substrate.

The nipping unit fixes the film substrate while the print pattern is transferred from the roll type printed film support unit to the film substrate and may move so as not to interrupt the progress of the film substrate when the unwinder and the printed film rewinder are driven. To this end, a controller of the nipping unit may further be comprised.

The nipping unit may move downwards so that vacuum suction can be efficiently performed by a vacuum suction unit of the roll type printed film support unit during the printing, in order not to interrupt the movement path of the printing roll. Further, the nipping unit may also move upwards so that a scratch does not occur on the lower surface of the film substrate. Accordingly, the roll printing apparatus according to the present invention may comprise a driver for vertically moving the nipping unit.

In order not to interrupt the movement path of the printing roll, or in order that the scratch does not occur on the lower surface of the film substrate, the roll type printed film support unit may move upwards and downwards.

An assistant fixing unit may further be comprised so that the printed film can be stably supplied to the nipping unit. It is preferred that the assistant fixing unit is provided between the unwinder and the nipping unit.

The roll printing apparatus according to the present invention may further comprise a position controller of the roll type printed film support unit for alignment of the printed film. The position controller of the roll type printed film support unit may be provided to be connected with the roll type printed film support unit. The position controller of the roll type printed film support unit may align the roll type printed film support unit so that the print pattern is transferred at an appropriate position on the film substrate by the printing roll, before transferring the print pattern on the film substrate. Further, as described above, the film substrate may also vertically move through the position controller of the roll type printed film support unit and as a result, it is possible to prevent the progress path of the printing roll from being interrupted and to prevent the scratch from occurring at the lower surface of the film substrate.

The roll printing apparatus according to the present invention may further comprise a drying or curing unit provided between the roll type printed film support unit and the rewinder. The drying or curing unit may dry or cure the print pattern transferred on the film substrate. The drying or curing unit may comprise a control means so as to dry or cure the print pattern under an appropriate condition. In the present invention, since a printed object is a film form, a drying or curing temperature may be controlled according to a film material.

The roll printing apparatus according to the present invention may further comprise a second unwinder which is provided between the roll type printed film support unit and the rewinder and supplies a film to be bonded with the film substrate. A kind of the film supplied from the second unwinder is not particularly limited as long as the bonding with the film substrate is required. For the bonding, a bonding means may further be comprised before the film substrate and the film supplied from the second unwinder is rewound around the rewinder. For example, a pressurizing means may further be comprised. The pressurizing means may be supplied through a structure with two rolls. Two films may be laminated by the pressurizing means.

The driving speed of the roll type printed film support unit may be synchronized with the driving speed of the printing roll which transfers the print pattern. That is, it is preferred that a linear velocity at which the roll type printed film support unit is driven corresponds with a linear velocity at which the first printing roll or the second printing roll is driven. Accordingly, the detailed pattern may be transferred. In this case, when calculating the driving speed of the first printing roll or the second printing roll, it is preferred that the driving speed is calculated based on the entire printing roll comprising the blanket.

The detailed pattern may be transferred by controlling the pressure between the roll type printed film support unit and the first printing roll or the second printing roll.

The roll printing apparatus according to the present invention, the roll type printed film support unit may comprise a fixing roll, a free rotation roll, and a porous sheet. In the roll type printed film support unit, a vacuum hole may be formed in an area of the fixing roll having an angle corresponding to an area in which the film substrate is bordered to the first printing roll or the second printing roll. Herein, the angle may be 0.1 to 180 degrees based on a rotation shaft of the roll type printed film support unit, but is not limited thereto. Further, vacuum holes may be formed over the entire area of the free rotation roll.

The vacuum holes of the fixing roll and the free rotation roll may be formed through vertical punching and only in the case where the vacuum hole of the fixing roll and the vacuum hole of the free rotation roll meet with each other, vacuum may be formed.

Figure 4:
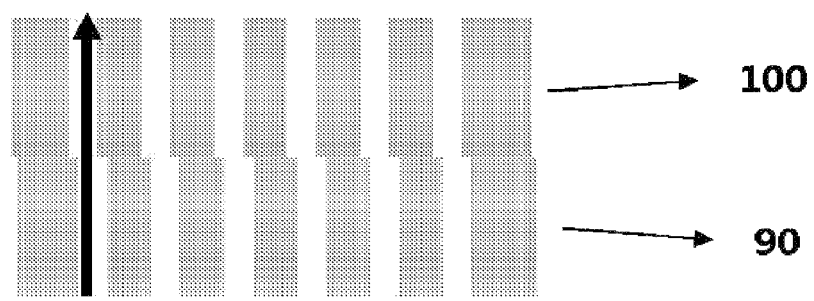
FIG. 4 is a schematic diagram illustrating a vacuum forming method of a printed film support unit of a roll printing apparatus according to the exemplary embodiment of the present invention.
Figure 5:
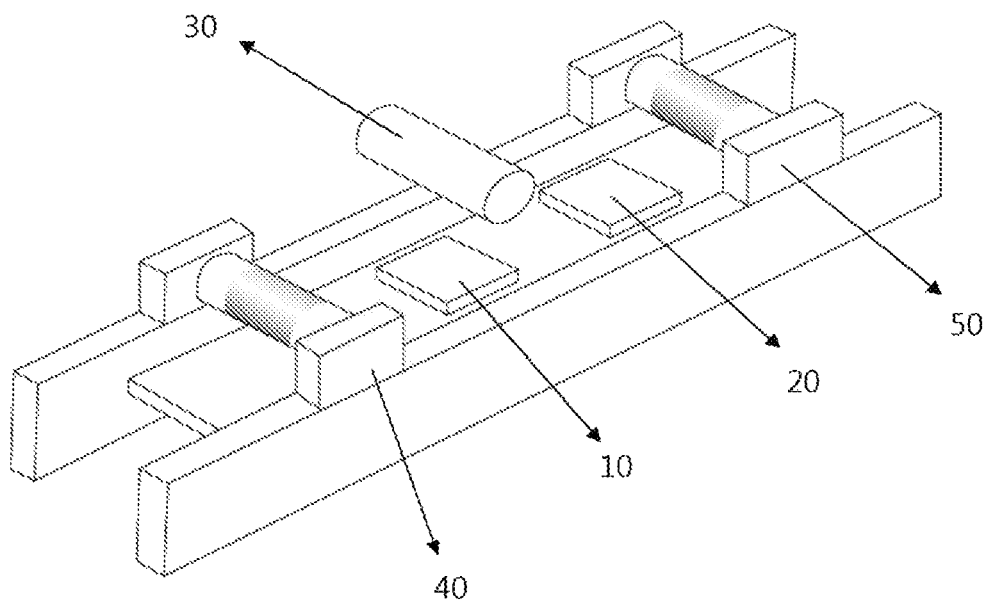
FIG. 5 is a side view of FIG. 1, schematically illustrating a roll printing apparatus according to an exemplary embodiment of the present invention.

As described above, the case where the vacuum hole of the fixing roll and the vacuum hole of the free rotation roll meet with each other and thus the vacuum is formed at the roll type printed film support unit is schematically shown in FIG. 4.

That is, in the roll printing apparatus according to the present invention, when the vacuum is formed over the entire roll type printed film support unit by forming the vacuum holes only in the area of the fixation roll corresponding to the area in which the film substrate and the first printing roll or the second printing roll meet with each other, the vacuum may be formed only in the area in which the film substrate and the first printing roll or the second printing roll meet with each other and the vacuum may be not formed in the area in which the film substrate and the first printing roll or the second printing roll do not meet with each other. Accordingly, when the pattern transferring process is performed with the blanket of the first printing roll or the second printing roll made of polydimethylsiloxne (PDMS), it is possible to prevent a pattern transfer defect from occurring due to the lift of the film substrate.

Figure 3:
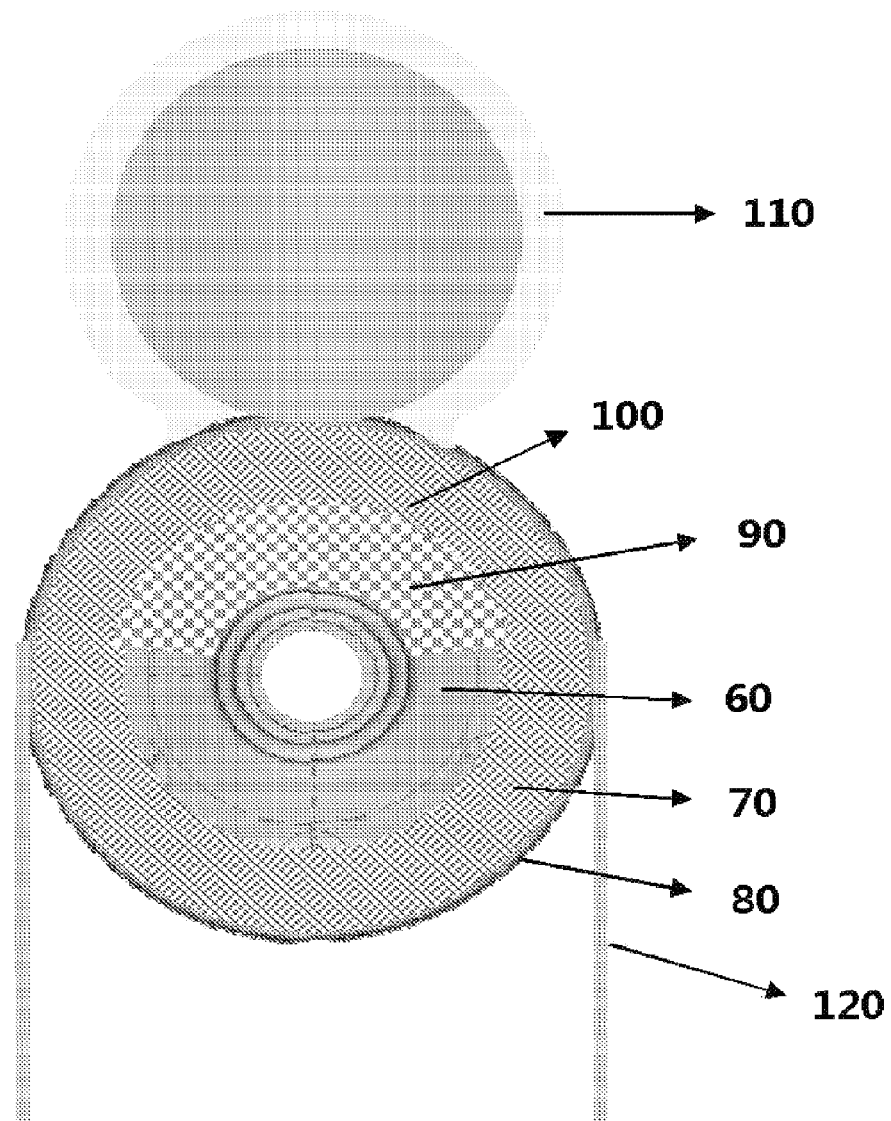
FIG. 3 is a schematic diagram illustrating a pattern transfer unit of a roll printing apparatus according to the exemplary embodiment of the present invention.

As described above, a detailed example of the roll type printed film support unit comprising the fixing roll, the free rotation roll, and the porous sheet is shown in the following FIG. 3.

In the roll printing apparatus according to the present invention, a driving motor, which moves the first printing roll toward the pattern transfer unit on the first cliché stage while rotating the first printing roll, may be comprised in the first printing unit and a driving motor, which moves the second printing roll toward the pattern transfer unit on the second cliché stage while rotating the second printing roll, may be comprised in the second printing unit.

The driving motor may be a linear motor. However, the driving motor is not limited thereto and motors capable of performing a forward motion in addition to a servomotor and a lock and pinion motor may be applied to the present invention.

In the roll printing apparatus according to the present invention, coaters coating the first printing roll and the second printing roll with ink may be comprised in the first printing unit and the second printing unit, respectively.

The coater may use a slit coater or a roll coater, but is not limited thereto.

The first printing unit and the second printing unit may be manufactured by stainless steel for processing of a precise machinery of which the surface is electrolytically polished.

As a detailed example, the printing roll may be manufactured by using SUS304 stainless steel, SUS305 stainless steel, or SUS316 stainless steel of which the surface is electrolytically polished. When the surface of stainless steel is processed with a metal atom such as nickel, it is possible to prevent corrosion and oxidation of stainless steel.

The blanket may be wound around the surfaces of the first printing roll and the second printing roll and in this case, the ink is coated on the blanket in the coating process using the coater.

In the roll printing apparatus according to the present invention, in order to improve precision of the pattern in the printing process of the first printing unit and the second printing unit, the first cliché stage or the second cliché stage may comprise an align unit for aligning the first cliché or the second cliché. Further, the first cliché stage or the second cliché stage may comprise a centering device for adjusting the position of the first cliché or the second cliché and may comprise a vacuum hole for fixing the first cliché or the second cliché.

Figure 2:
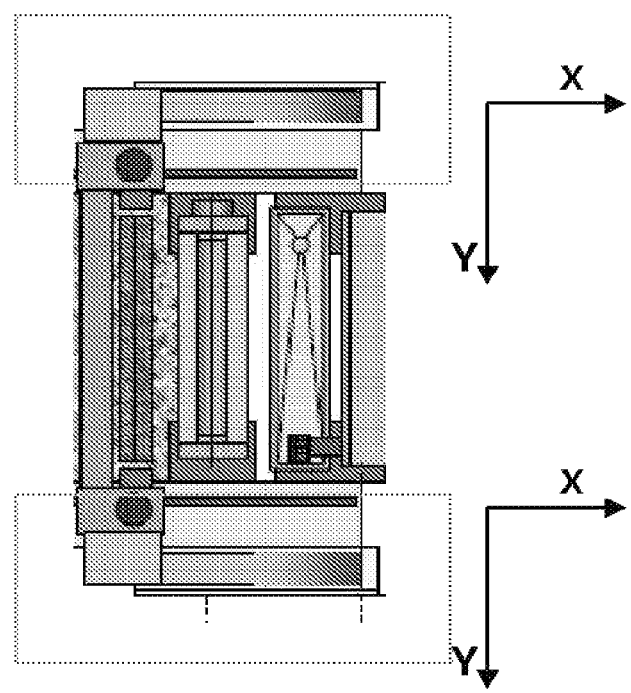
FIG. 2 is a schematic diagram illustrating a first printing unit or a second printing unit of a roll printing apparatus according to the exemplary embodiment of the present invention.

In the roll printing apparatus according to the present invention, an aligning device may be comprised in the first printing unit or the second printing unit, in the case where the alignment is adjusted by recognizing the position of the first cliché or the second cliché comprised on the first cliché stage or the second cliché stage in addition to the aligning method of the first cliché or the second cliché. In this case, the first printing unit or the second printing unit may comprise an additional motor driving unit capable of separately adjusting minute positions in an X axis, a Y axis, and a Z axis at the left side and the right side which support the first printing roll or the second printing roll, respectively. As described above, the first printing unit or the second printing unit of the roll printing apparatus according to an exemplary embodiment of the present invention is schematically shown in the following FIG. 2.

By the aligning method, in the case where an edge axis of the film substrate and a pattern axis of the first cliché or the second cliché do not coincide with each other by detecting the edge of the film substrate, the printing positions thereto may be complementary to each other. In this case, a diagonal travel of the film substrate may be compensated through a position change of the rolls.

In the roll printing apparatus according to the present invention, since the content for an ink composition and the like is the same as known in the art, the detailed description thereto will be omitted.

The roll printing apparatus according to the present invention may be applied to a reverse offset printing.

The roll printing apparatus according to the present invention may be used in various fields such as a manufacturing process of a thin film transistor (TFT) substrate configuring a gate-gate insulation film-active-passivation-pixel by using a color filter pattern; semiconductor and conductor; and an insulation film. Further, the present invention provides a roll printing method using the roll printing apparatus.

An exemplary embodiment of the roll printing method according to the present invention comprises 1) preparing a first stage with a first cliché and a second stage with a second cliché on the same line and preparing a pattern transfer unit provided at the lower portion between the first stage and the second stage and comprising a roll type printed film support unit with a roll type film substrate, 2) moving a first printing roll coated with first ink to the pattern transfer unit on the first stage and printing the first ink on the roll type film substrate, 3) moving a second printing roll coated with second ink to the pattern transfer unit on the second stage while returning the first printing roll to the initial position and printing the second ink on the roll type film substrate, and 4) repeating step 1) to step 3 in sequence while returning the second printing roll to the initial position.

Herein, the roll printing method may perform 3') carrying out the first cliché of the first stage and supplying an additional cliché at the same time with step 3) and 4') carrying out the second cliché of the second stage and supplying an additional cliché, and carrying out the film substrate of the pattern transfer unit and supplying an additional film substrate at the same time with step 4).

In the roll printing method according to the present invention, the units for carrying out and supplying the cliché, the film substrate, and the like in the roll printing apparatus may use a known method in the art or the method as described above.

Hereinafter, an exemplary embodiment of the present invention will be described in detail with reference to the accompanying drawing.

A roll printing apparatus according to an exemplary embodiment of the present invention is shown in the following FIG. 1.

As shown in FIG. 1, the roll printing apparatus according to the present invention may comprise 1) a first cliché stage 10, 2) a second cliché stage 20, 3) a pattern transfer unit 30 provided between the first cliché stage 10 and the second cliché stage 20 and comprising a roll type printed film support unit, 4) a first printing unit 40 comprising a first printing roll moving to the pattern transfer unit 30 on the first cliché stage 10, and 5) a second printing unit 50 comprising a second printing roll moving the pattern transfer unit 30 on the second cliché stage 20, in which the first cliché stage 10 and the second cliché stage 20 may be disposed on the same line and a film substrate may be comprised in the roll type printed film support unit.

According to the present invention, it is possible to perform a continuous roll printing by performing a printing process with one printing roll and performing a printing process with the other printing roll while returning the printing roll, by using a pair of printing roll devices. Accordingly, the present invention can reduce the tack time in half as compared with the related art and as a result, it is possible to improve the productivity by two times or more. Further, in this case, the printed substrate and the next printing substrate can be efficiently replaced with each other, thereby improving productivity.

The invention claimed is:

1. A roll printing apparatus, comprising:
   1) a first cliché stage;
   2) a second cliché stage;
   3) a pattern transfer unit provided between the first cliché stage and the second cliché stage and comprising a roll type printed film support unit;
   4) a first printing unit comprising a first printing roll capable of moving toward the pattern transfer unit while on the first cliché stage; and
   5) a second printing unit comprising a second printing roll capable of moving toward the pattern transfer unit while on the second cliché stage,
   wherein the first cliché stage and the second cliché stage are disposed on a same line and the roll type printed support unit supports a film substrate.

2. The roll printing apparatus of claim 1, wherein the pattern transfer unit comprises a printed film supplying unit continuously supplying the film substrate and a printed film collecting unit continuously collecting the film substrate.

3. The roll printing apparatus of claim 2, wherein the roll type printed film support unit is disposed between the printed film supplying unit and the printed film collecting unit.

4. The roll printing apparatus of claim 2, wherein the printed film supplying unit is an unwinder and the printed film collecting unit is a rewinder.

5. The roll printing apparatus of claim 1, wherein the roll type printed film support unit comprises a fixing roll, a free rotation roll, and a porous sheet.

6. The roll printing apparatus of claim 5, wherein a vacuum hole is formed in an area of the fixing roll having an angle corresponding to an area in which the film substrate is bordered to the first printing roll or the second printing roll.

7. The roll printing apparatus of claim 6, wherein the angle is 0.1 to 180 degrees based on a rotation shaft of the roll type printed film support unit.

8. The roll printing apparatus of claim 5, wherein vacuum holes are formed over an entire area of the free rotation roll.

9. The roll printing apparatus of claim 1, wherein a driving motor, which moves the first printing roll toward the pattern transfer unit on the first cliché stage while rotating the first printing roll, is comprised in the first printing unit.

10. The roll printing apparatus of claim 1, wherein a driving motor, which moves the second printing roll toward the pattern transfer unit on the second cliché stage while rotating the second printing roll, is comprised in the second printing unit.

11. The roll printing apparatus of claim 1, wherein an align unit for aligning the first cliché or the second cliché is comprised in the first cliché stage or the second cliché stage.

12. The roll printing apparatus of claim 1, wherein a centering device for adjusting a position of the first cliché or the second cliché is comprised in the first cliché stage or the second cliché stage.

13. The roll printing apparatus of claim 1, wherein a vacuum hole for fixing the first cliché or the second cliché is comprised in the first cliché stage or the second cliché stage.

14. The roll printing apparatus of claim 1, wherein an align unit is comprised in the first printing unit or the second printing unit and a motor driving unit adjusting a position of the first printing roll or the second printing roll is comprised in the first printing unit or the second printing unit.

15. The roll printing apparatus of claim 1, wherein the roll printing apparatus is used for a reverse offset printing.

16. A roll printing method using the roll printing apparatus of claim 1.

17. A roll printing method, comprising:
   1) preparing a first stage with a first cliché and a second stage with a second cliché in a same line and preparing a pattern transfer unit provided at a lower portion between the first stage and the second stage and comprising a roll type printed film support unit with a film substrate;
   2) moving a first printing roll coated with a first ink to the pattern transfer unit on the first stage and printing the first ink on the film substrate;
   3) moving a second printing roll coated with a second ink to the pattern transfer unit on the second stage while returning the first printing roll to an initial position and printing the second ink on the film substrate; and
   4) repeating step 1) to step 3 in sequence while returning the second printing roll to the initial position.

18. The roll printing method of claim 17, further comprising:
   3') carrying out the first cliché of the first stage and supplying an additional cliché simultaneously with step 3).

19. The roll printing method of claim 17, further comprising:
   4') carrying out the second cliché of the second stage and supplying an additional cliché, and carrying out the film substrate of the pattern transfer unit and supplying an additional film substrate simultaneously with step 4).

20. The roll printing method of claim 17, wherein the pattern transfer unit comprises a printed film supplying unit continuously supplying the film substrates and a printed film collecting unit continuously collecting the film substrates.

* * * * *